(12) United States Patent
Jacobson

(10) Patent No.: US 6,208,578 B1
(45) Date of Patent: Mar. 27, 2001

(54) PARTIAL REPLACEMENT OF PARTIALLY DEFECTIVE MEMORY DEVICES

(75) Inventor: John O. Jacobson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/451,406

(22) Filed: Nov. 30, 1999

Related U.S. Application Data

(63) Continuation of application No. 09/326,211, filed on Jun. 4, 1999, now Pat. No. 6,009,025, which is a continuation of application No. 08/916,846, filed on Aug. 22, 1997, now Pat. No. 5,920,513.

(51) Int. Cl.[7] ........................................... G11C 7/00
(52) U.S. Cl. ........................................ 365/225.7; 365/200
(58) Field of Search .................................. 365/225.7, 200

(56) References Cited

U.S. PATENT DOCUMENTS

| | | | |
|---|---|---|---|
| 4,791,319 | 12/1988 | Tagami et al. | 307/441 |
| 5,107,464 | 4/1992 | Sahara et al. | 365/200 |
| 5,200,652 | 4/1993 | Lee | 307/465 |
| 5,265,054 | 11/1993 | McClure | 365/200 |
| 5,276,834 | 1/1994 | Mauritz et al. | 395/425 |
| 5,703,817 | 12/1997 | Shiratake et al. | 365/200 |
| 5,706,231 | 1/1998 | Kokubo | 365/200 |

OTHER PUBLICATIONS

"Micron Technology, Inc. 4 MEGx4 DRAM catalog pages", 3–33 to 3–48, (1995).

*Primary Examiner*—Son T. Dinh
(74) *Attorney, Agent, or Firm*—Schwegman, Lundberg, Woessner & Kluth, P.A.

(57) ABSTRACT

The partial replacement of partially defective integrated circuit devices, such as memory devices, is disclosed. In one embodiment, the data lines coupled to different sections of the memory array of a memory device have inserted in series therein normally closed links. If a section is found to be defective, then the link for the data line coupled to the section is opened. This permits a repair device to be coupled to the memory device such that only the defective section is replaced. The address and control lines of the repair device are coupled to their counterpart lines of the memory device. However, a data line of the repair device is coupled to a data line of the memory device only if the data line of the memory device is coupled to a defective section.

24 Claims, 5 Drawing Sheets

PARTIAL REPLACEMENT OF PARTIALLY DEFECTIVE MEMORY DEVICES

This application is a continuation of U.S. Ser. No. 09/326,211, filed Jun. 4, 1999, now U.S. Pat. No. 6,009,025, which is a continuation of U.S. Ser. No. 08/916,846, filed Aug. 22, 1997, now U.S. Pat. No. 5,920,513, issued Jul. 6, 1999.

FIELD OF THE INVENTION

The present invention relates generally to integrated circuit devices and more particularly to the partial replacement of partially defective integrated circuit memory devices.

BACKGROUND OF THE INVENTION

Technological advances have permitted semiconductor integrated circuit memory devices to comprise significantly more circuit elements in a given silicon area. Reducing and eliminating defects in the circuit elements has, however, become increasingly more difficult with the increased number of circuit elements. To achieve higher population capacities, circuit designers strive to reduce the size of individual circuit elements to maximize available die real estate. The reduced size makes these circuit elements increasingly susceptible to defects caused by material impurities during fabrication.

Relying on zero defects in the fabrication of integrated circuit memory devices is an unrealistic goal, however. Therefore, redundant circuit elements are provided on the devices to reduce the number of scrapped devices. If a primary circuit element of a device is determined to be defective, a redundant circuit element is substituted for the defective primary circuit element. Substantial reductions in scrap are achieved by using redundant circuit elements without substantially increasing the cost of the device.

However, occasionally a defective circuit element of a device cannot be repaired by using a redundant element also within the device, or such repair is economically or logistically unfeasible. For example, a single bit failure may be serious enough that it is not internally repairable. In this and other situations, the entire memory device may be replaced by a redundant device. There are drawbacks to this approach, however. Even if the memory device is only partially defective, replacing it with a redundant device means that many of the operational elements are not used and thus wasted. Furthermore, the redundant device must itself be completely operational, or otherwise the replacement will not be successful.

Complete replacement of a defective memory device with a redundant device may therefore be economically undesirable in that a nearly operational device must be scrapped and replaced by a completely operational device. For these reasons, and for other reasons stated below which will become apparent to those skilled in the art upon reading and understanding the specification as disclosed herein, there is a need for the replacement of a partially defective integrated circuit device without having to completely replace the partially defective device. That is, there is a need to partially replace the defective device such that use is still made of many, most or all of the operational elements of the partially defective device.

SUMMARY OF THE INVENTION

The above-mentioned problems and other problems are addressed by the present invention, which will be understood by reading and studying the following specification. The present invention relates to the partial replacement of partially defective integrated circuit memory devices. A memory device is described which has one or more links having an initial closed configuration, wherein each link is coupled to a data line coupled to a section of the memory array. Each link is configured to open to permit replacement of just the section of the memory array coupled to the data line to which the link is coupled.

In particular, in one embodiment of the invention, a multi-chip module includes a plurality of memory devices mounted on a substrate and a plurality of data lines, each coupled to a memory device. A normally closed link is coupled to each data line. If one of the memory devices is partially defective, the appropriate link is opened. This is the link that is coupled to the data line which is coupled to the defective section of the memory device. A partially or completely operating memory device is coupled to the module at a repair site to replace only the defective section.

The operable sections of the partially defective memory device thus remain in use and are not wasted. Furthermore, the replacement memory device may itself be partially defective, since it is not completely replacing the other memory device. This is economically advantageous because memory devices that might otherwise be scrapped may serve as replacement devices, and in any case completely operable replacement devices are not required. Still other and further aspects, advantages and embodiments of the present invention will become apparent in the following description and by reference to the following drawings.

DETAILED DESCRIPTION OF THE DRAWINGS

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1A:
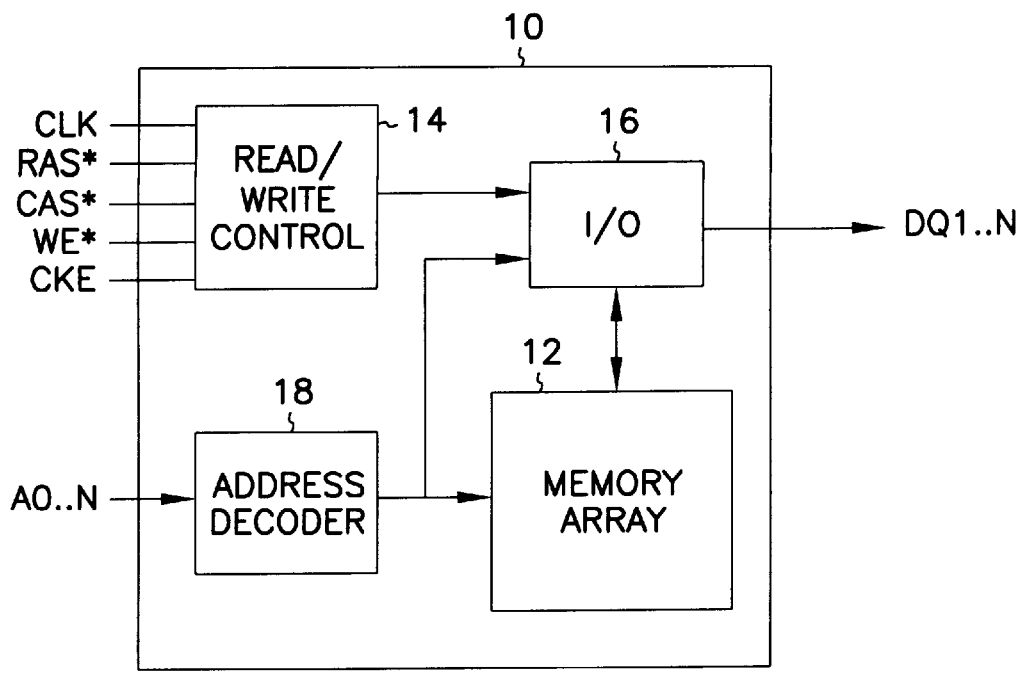
FIG. 1(a) is a block diagram of a typical memory device in conjunction with which an embodiment of the invention may be implemented.

The present invention provides for the partial replacement of partially defective memory devices. A typical memory device in conjunction with which an embodiment of the invention is implemented is shown in FIG. 1(a). Memory device 10 includes memory array 12, control circuit 14, input/output buffers 16, and address decoder 18. Memory array 12 includes a plurality of memory cells organized into rows and columns. The memory cells are accessed in response to an address signal provided on the address lines A0 . . . AN running to address decoder 18, which includes both row and column decoder circuitry. Input/output buffers 16 are provided for bi-directional communication via the data communications lines DQ1 . . . DQN running out of buffers 16. Control circuit 14 regulates the memory device operations in response to controls signals including, but not limited to, a Clock (CLK), a Row Access Strobe (RAS*), a Column Access Strobe (CAS*), a Write Enable (WE*), and a Clock Enable (CKE).

Figure 1B:
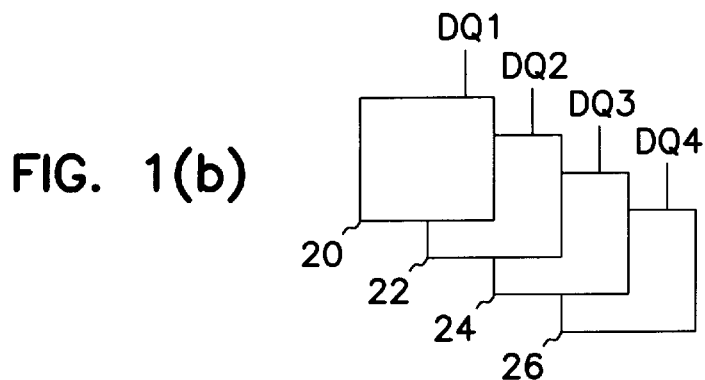
FIG. 1(b) is a block diagram showing in more logical detail the memory array of the memory device of FIG. 1(a), according to an embodiment of the invention.

Memory array 12 is shown in more logical detail in FIG. 1(b). The memory array is divided into planes 20, 22, 24 and 26. Each of the planes corresponds to a particular data line (i.e., DQ1, DQ2, DQ3 or DQ4). Each of the planes is a separate section of the memory array. The separate sections are shown as different planes to better illustrate the organization of the memory cells of the array. This does not, however, necessarily correspond to the actual physical construction of the array. Each data line can access only those memory cells within the plane of the array to which it corresponds. Where one or more memory cells within a particular plane or section are defective, the section is said to be defective. As described herein, the present invention provides for replacement of only those sections of the memory array of a memory device that are defective with a repair memory device.

As will be appreciated by those skilled in the art, the present invention is not limited to any particular type of memory device or repair memory device. In one embodiment, the devices are dynamic random-access-memories (DRAMs), including those available from Micron Technology, Inc., of Boise, Id., as part numbers MT4LC4M4D42TC2-6TC (for the memory device) and MT4C4D42SC2-6TRA (for the repair device). In other embodiments, the devices are static random-access-memories (SRAMs), flash memories, synchronous dynamic random-access-memories (SDRAMs), extended-data-out random-access-memories (EDO RAMs), and burst-extended-data-out random-access-memories (BEDO RAMs), as those skilled in the art will appreciate.

Figure 2:
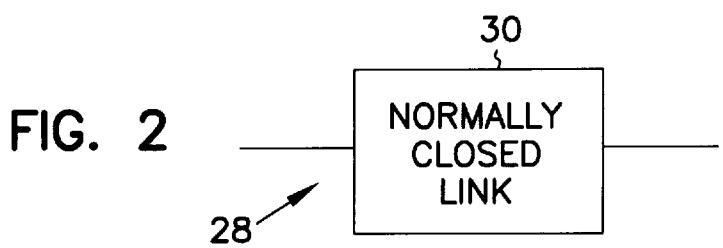
FIG. 2 is a block diagram of a normally closed link for a data line of a section of the memory array of a memory device, according to one embodiment of the invention.

A block diagram of a normally closed link for a data line of a section of the memory array of a memory device is shown in FIG. 2. Data line 28 is representative of each of the data lines shown in FIG. 1(a) and FIG. 1(b). Data line 28 has inserted in series therein normally closed link 30. Link 30 is normally closed in that it has an initial closed configuration such that it permits electrical current to travel through data line 28. Link 30 is configured to open such that when link 30 is open (that is, link 30 is in an opened configuration), no electrical current can travel through data line 28. Therefore, the section of the memory array to which a data line is coupled may be disabled by opening the normally closed link for the data line. This opens the data line and does not permit electrical current to travel to or from that section of the array.

As will also be appreciated by those skilled in the art, the present invention is not limited to any particular type of normally closed link. In one embodiment, the link is a standard polysilicon fuse or resistor link. The fuse comprises a polysilicon conductor approximately $1\mu$ thick, which is fabricated such that in its normal state there is a complete electrical path through the fuse. A high power laser is used to open the electrical path by evaporating a portion of the polysilicon. In another embodiment of the invention, a burst of high current is asserted to the data line to open the path by blowing the fuse.

Figure 3:
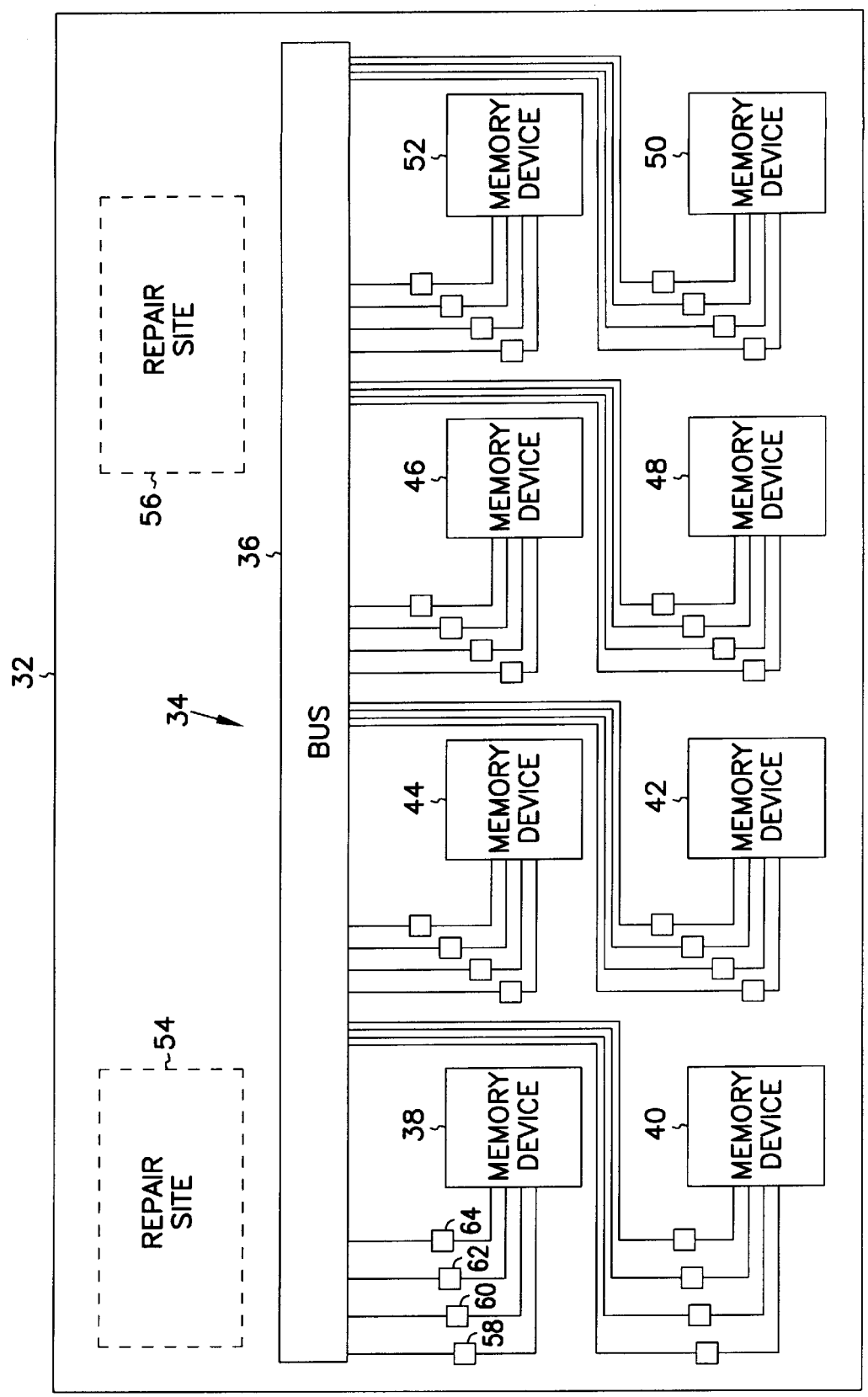
FIG. 3 is a diagram of a multi-chip module according to an embodiment of the invention.

A block diagram of a multi-chip module according to an embodiment of the present invention is shown in FIG. 3. Multi-chip module 32 may be a single in-line memory module (SIMM), or any other type of multi-chip module. Multi-chip module includes substrate 34, with bus 36 and memory devices 38, 40, 42, 44, 46, 48, 50 and 52 mounted thereon. Bus 36 permits coupling of module 32 to a computer or other device receptive to the module. Substrate 34 also includes space for a maximum of two repair devices to be mounted thereon. These are shown as repair sites 54 and 56.

The control lines (e.g., CLK, RAS*, CAS*, WE*, and CKE), the address lines (e.g., A0 . . . AN), and the data lines (e.g., DQ1 . . . DQN) of each of memory devices 38, 40, 42, 44, 46, 48, 50 and 52 are coupled to bus 36 to permit communication between the devices and the bus. However, for sake of clarity, only the data lines for each of the memory devices are shown. Each data line includes a normally closed link inserted in series therein. For example, memory device 38 has data lines with normally closed links 58, 60, 62 and 64. As has been explained, each of the normally closed links permits the individual enablement of a section of the memory array of a memory device. As shown in FIG. 3, none of the links are opened. All the sections of the memory arrays of all the memory devices are enabled.

Figure 4:
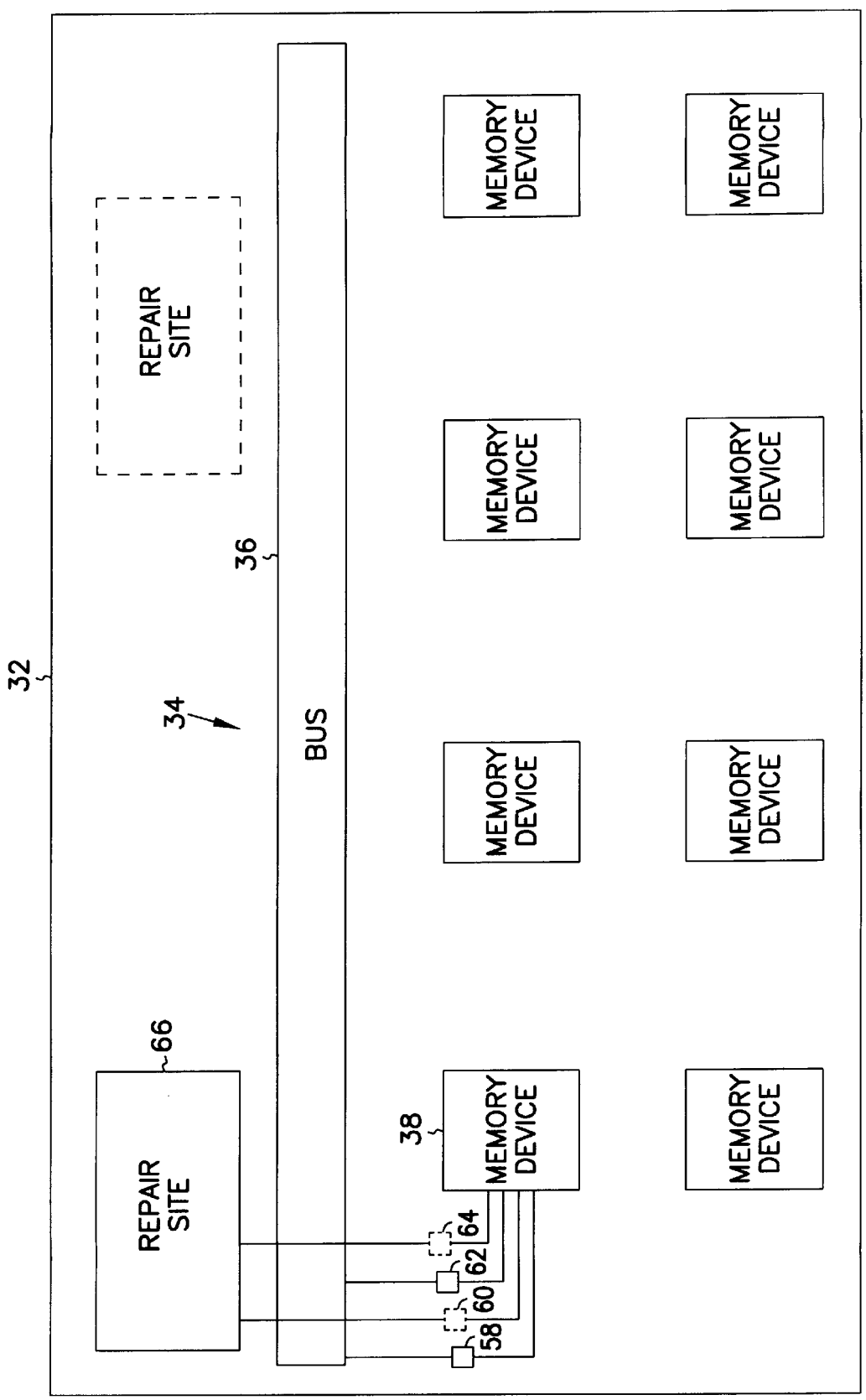
FIG. 4 is a diagram of another multi-chip module according to an embodiment of the invention.

However, if one or more of the sections are defective, then one or two repair devices are mounted at the repair sites to replace the defective sections. This is shown in FIG. 4, which is a block diagram of a multi-chip module according to an embodiment of the invention. As compared to FIG. 3, the data lines for all the memory devices except device 38 are not shown for sake of clarity. Multi-chip module 32 in FIG. 4 has repair device 66 mounted to substrate 34, at the location specified as repair site 54 in FIG. 3. While links 58 and 62 of memory device 38 remain closed in FIG. 4, links 60 and 64 are open, as shown by dotted lines. This means that the sections of the memory array of device 38 to which links 60 and 64 are coupled via data lines cannot receive communications to or from bus 36. They are effectively disabled, even though the remainder of memory device 38 is operable (i.e., the sections of the memory array to which links 58 and 62 are coupled via data lines).

The control lines (e.g., CLK, RAS*, CAS*, WE*, and CKE) and the address lines (e.g., A0 . . . AN) of repair device 66 are each coupled to the corresponding control and address lines of memory device 38 (not shown in FIG. 4). Furthermore, one data line of repair device 66 is coupled to each data line of memory device 38 having a link that is open. Thus, one data line of device 66 couples the data line of device 38 having link 60, and another data line of device 66 couples the data line of device 38 having link 64. Insofar as repair device 66 has other data lines, they are not used (i.e., not connected). The data lines of memory device 38 having links that are open—i.e., the line with link 58 and the line with link 62—do not have a data line of memory device 66 coupled thereto.

Figure 5:
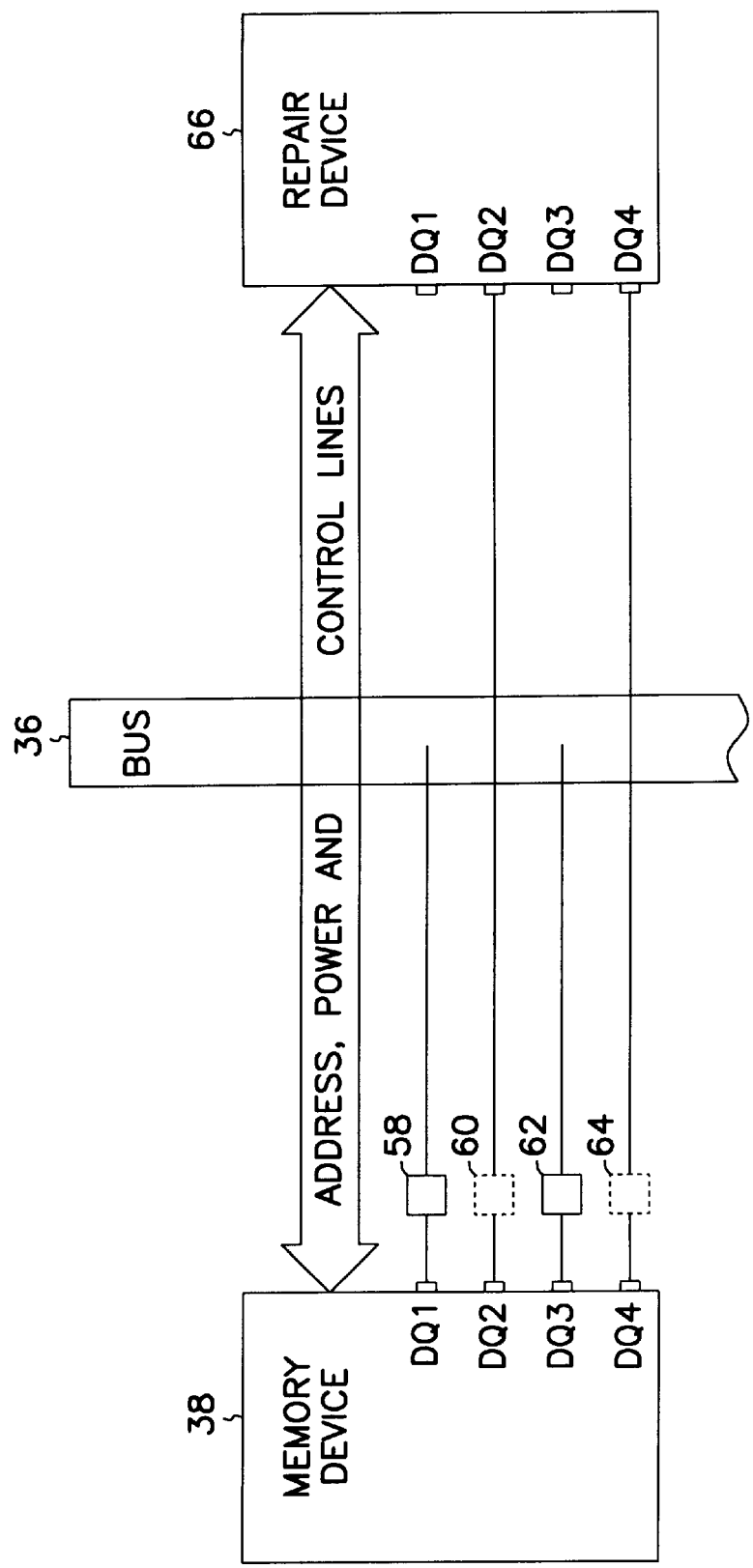
FIG. 5 is a diagram showing in more detail the partially defective device and the repair device shown in FIG. 4; and, FIG. 6 is a method illustrating the partial replacement of a partially defective device in one embodiment of the invention.

Referring now to FIG. 5, a block diagram illustrating memory device 38 and repair device 66 in more detail is shown. The DQ1 pin of device 38 has closed link 58;

therefore, the DQ1 pin of device 66 remains uncoupled. Similarly, the DQ3 pin of device 38 has closed link 62; therefore, the DQ3 pin of device 66 remains uncoupled. However, the DQ2 pin of device 38 has opened link 60; therefore, the DQ2 pin of device 66 is coupled to the DQ2 port of bus 36. Similarly, the DQ4 pin of device 38 has opened link 64; therefore, the DQ4 pin of device 66 is coupled to the DQ4 port of bus 36. All other pins of the devices are coupled to the bus (not shown in FIG. 5), such that corresponding address and control lines of the devices are coupled to one another.

Thus, the sections of the memory array of memory device 38 corresponding to data lines DQ2 and DQ4 are defective, while the sections of the memory array of device 38 corresponding to data lines DQ1 and DQ3 are operative. Rather than replacing device 38 entirely, repair device 66 only replaces those sections of device 38 that are defective. The section of the memory array of repair device 66 corresponding to data line DQ2 of device 66 replaces the section of the memory array of device 38 corresponding to data line DQ2 of device 38. Similarly, the section of the array of device 66 corresponding to data line DQ4 of device 66 replaces the section of the memory array of device 38 corresponding to data line DQ4 of device 38. The functionality of data lines DQ2 and DQ4 is performed by device 66, while the functionality of data lines DQ1 and DQ3 is performed by device 38.

Because all the lines of device 66 other than data lines are coupled to their corresponding lines of device 38, when bus 36 receives a command and corresponding address, both device 38 and repair device 66 process the command. If the command corresponds to a section of the memory related to DQ1 or DQ3, device 38 provides the output, since its DQ1 and DQ3 lines are coupled to bus 36, while the DQ1 and DQ3 lines of device 66 are not. Conversely, if the command corresponds to a section of the memory related to DQ2 or DQ4, device 66 provides the output, since its DQ2 and DQ4 lines are coupled to bus 36, while the DQ2 and DQ4 lines of device 38 are not due to links 60 and 64 having been opened.

Because the sections of the memory array of repair device 66 that correspond to data lines DQ1 and DQ3 of repair device 66 are not coupled at all, these sections do not have to be operable for device 66 to successfully partially replace device 38. That is, repair device 66 may itself be a partially defective device. So long as it has two operable sections within the memory array to replace the two defective sections of the memory array of device 38, repair device 66 is adequate. This means that otherwise scrap memory devices may still be used as repair devices in conjunction with the present invention, providing for a great economical advantage.

Figure 6:
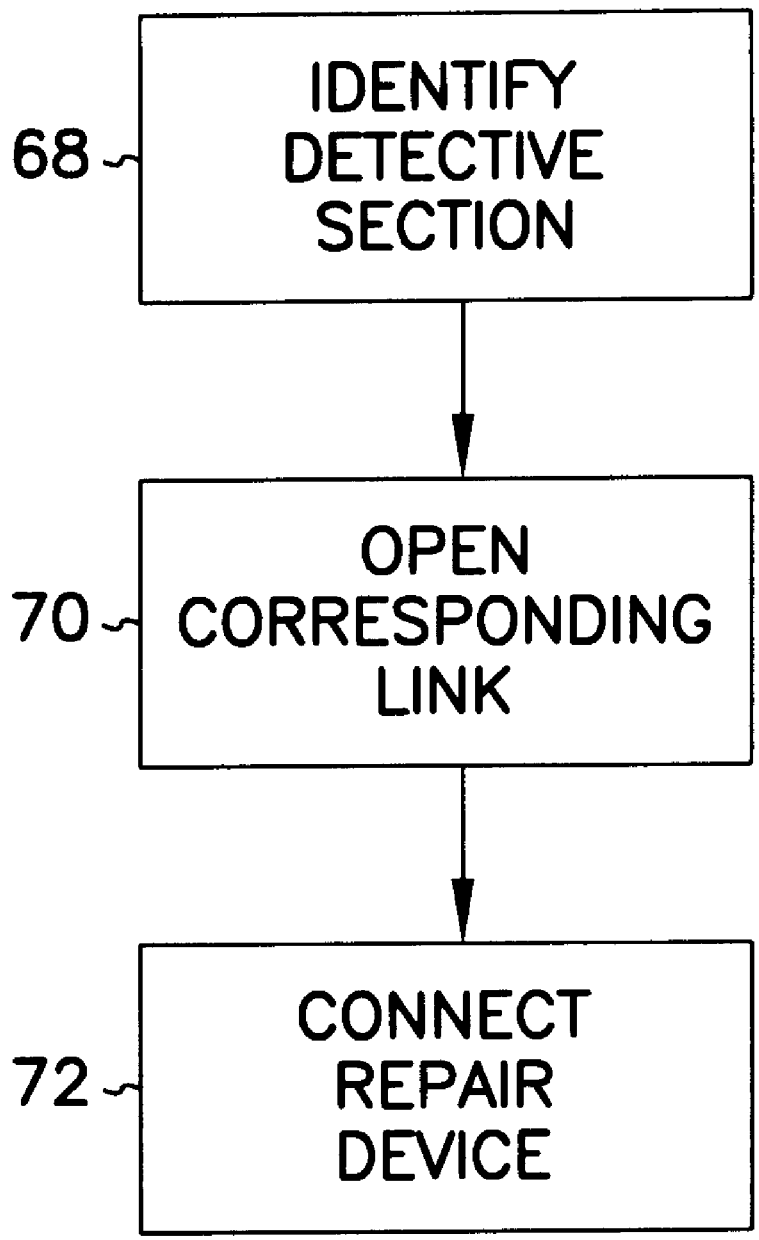

Referring now to FIG. 6, a method according to one embodiment of the invention is shown. In step 68, a defective section of the memory array of a memory device is identified. The present invention is not limited to any particular manner in which the defective section is identified. However, in one embodiment, a logic one is written to each memory cell within the section, and then the memory cell is read. If at least one memory cell does not return a logic one when read, the section is defective.

In step 70, the normally closed link coupled to the data line for that section is opened. Again, the present invention is not limited to any particular manner in which the link is opened. In one embodiment of the invention, as has been described, the link is opened by exposure to a high power laser (i.e., an external heat source). In another embodiment of the invention, as has also been described, the link is opened by assertion of a high current to the data line to which the link is coupled in series.

Finally, in step 72, a repair device is connected to the memory device such that just the defective section of the memory device is replaced. The pins of the repair device corresponding to the address and control lines are coupled to their counterpart pins of the memory device. The data line of an operative section of the memory array of the repair device is coupled to the data line of the defective section of the memory array of the memory device. The data lines for the other sections of the memory array of the repair device are not coupled at all. These sections do not have to be operable.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the following claims and equivalents thereof.

I claim:

1. A memory system comprising:

a bus;

a memory device having a plurality of memory sections, each of the memory sections connected to the bus via a data line, each data line having a normally closed link, wherein the link is opened to disconnect a memory section from the bus when the memory section is defective; and a repair site to receive a repair device when the memory device has a defective memory section, the repair device including at least one repair section, wherein the repair section connects to the bus to replace the defective memory section.

2. The memory system of claim 1, wherein the memory device and the repair site are located in the same substrate.

3. The memory system of claim 1, wherein the repair device is a partially operational.

4. The memory system of claim 1, wherein the link is opened by a laser source.

5. The memory system of claim 1, wherein the link is opened by a high current source.

6. The memory of claim 1, wherein the repair section connects to the bus via a repair data line, wherein the repair data line corresponds to a data line having an opened link.

7. A memory system comprising:

a substrate a memory device located on the substrate, the memory device including a plurality of memory sections; and a repair site located on the same substrate; wherein the repair site receives a repair device when at least one of the memory sections is defective, wherein the repair device replaces only a defective section of the memory device, wherein the repair device is partially operational.

8. The memory system of claim 7, wherein each of the memory sections connects to a corresponding a data line, wherein the data line includes a normally closed link, wherein the link is opened to prevent electrical current to travel to and from the a memory section when the memory section is defective.

9. The memory system of claim 8, wherein the link is opened by an external heat source.

10. The memory system of claim 7, wherein the memory device further comprises control lines and address lines, wherein the control and address lines connects to corresponding control and address lines of the repair device when one of the memory sections is defective.

11. The memory system of claim 7, wherein the repair device process the same command as the memory device to replace a defective memory section of the memory device.

12. A memory system comprising:
   a substrate
   a memory device located on the substrate, the memory device including at least one defective section; and
   a repair site located on the same substrate; the repair site including a repair device mounted thereon to replace the defective memory section, wherein a functionality of the defective section is performed by the repair device, wherein a functionality of a non-defective memory section is performed by the memory device.

13. The memory of claim 12, wherein the defective section connects to a memory data line having a link, wherein the link is opened to prevent communications to and from the defective section.

14. The memory system of claim 12, wherein the link is opened by an external heat source.

15. The memory of claim 12, wherein the repair device include a repair section connected to a repair data line, wherein the repair data line connects to the memory data line connected to the defective section to only replace the defective section.

16. A multi-chip module comprising:
   a substrate;
   a plurality of memory devices located one the substrate, each of the memory devices having a plurality of memory sections, each memory section connecting to a data line, each data line having a normally closed link, wherein at least one of the memory device has a defective memory section, wherein a link connected to the defective memory section is opened to prevent communications to and from the defective memory section; and
   a plurality of repair sites located on the same substrate, at least one of the repair site having a repair device mounted on the repair site, wherein the repair device operates to replace only the defective memory section.

17. The multi-chip module of claim 16, further comprises a bus, wherein only a portion of the repair device is connected the bus to replace only the defective memory section.

18. The multi-chip module of claim 16, wherein the repair device is partially operative.

19. A multi-chip module comprising:
   a substrate;
   a plurality of memory devices located on the substrate, at least one memory device being a partially defective memory device; and
   a plurality of repair sites located on the same substrate, the repair site having at least one repair device mounted on one of the repair site to replace the partially defective memory device.

20. The multi-chip module of claim 19, wherein each of the memory devices includes a plurality of memory data lines, each of the data line having a normally closed link, wherein a link of a memory data line connected to a defective part of a memory device is opened to prevent communications to and from the defective part.

21. The multi-chip module of claim 19, wherein the repair device comprises a plurality of repair data lines, each of the repair data line corresponding to a memory data line, wherein only a data line connected to a defective part of the memory device is replaced by a corresponding repair data line.

22. A method of repairing a partially defective memory device, the method comprising:
   identifying a defective section of the memory device;
   mounting a repair device on a repair site located near the memory device;
   opening a link of connected between the defective section and a bus;
   connecting corresponding control lines and address lines of the memory device and the repair device to enable both devices to receive the same command from the bus; and
   connecting a repair data line from the repair device to the bus to enable a section of the repair device to replace only the defective section of the memory device.

23. The method of claim 22, wherein opening a link includes applying an external heat source to the link.

24. The method of claim 22 further including, connecting a repair data line to a corresponding memory data line connected to the defective memory section.

* * * * *

UNITED STATES PATENT AND TRADEMARK OFFICE
CERTIFICATE OF CORRECTION

PATENT NO. : 6,208,578 B1
DATED : March 27, 2001
INVENTOR(S) : Jacobson

It is certified that error appears in the above-identified patent and that said Letters Patent is hereby corrected as shown below:

Column 7,
Line 7, delete "process" and insert -- processes --, therefor.
Line 25, delete "include" and insert -- includes --, therefor.
Line 31, delete "one" and insert -- on --, therefor.
Line 35, delete "device" and insert -- devices --, therefor.
Line 41, delete "site" and insert -- sites --, therefor.
Line 46, after "connected", insert -- to --.

Column 8,
Line 11, delete "site" and insert -- sites --, therefor.
Line 15, delete "line" and insert -- lines --, therefor.
Line 22, delete "line" and insert -- lines --, therefor.
Line 32, delete "link of" and insert -- link --, therefor.

Signed and Sealed this

Twenty-fifth Day of June, 2002

Attest:

JAMES E. ROGAN
Attesting Officer
Director of the United States Patent and Trademark Office